(12) United States Patent
Visser et al.

(10) Patent No.: US 10,502,983 B2
(45) Date of Patent: Dec. 10, 2019

(54) NANOSTRUCTURED FLAT LENSES FOR DISPLAY TECHNOLOGIES

(71) Applicant: Applied Materials, Inc., Santa Clara, CA (US)

(72) Inventors: Robert Jan Visser, Menlo Park, CA (US); Avishek Ghosh, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/459,405

(22) Filed: Jul. 1, 2019

(65) Prior Publication Data

US 2019/0324297 A1    Oct. 24, 2019

Related U.S. Application Data

(63) Continuation of application No. 15/992,305, filed on May 30, 2018, now Pat. No. 10,338,415.

(30) Foreign Application Priority Data

Jun. 2, 2017 (IN) .............................. 201741019417
Dec. 18, 2017 (IN) .............................. 201741045374

(51) Int. Cl.
*G02F 1/01* (2006.01)
*G02B 27/01* (2006.01)
(Continued)

(52) U.S. Cl.
CPC ......... *G02F 1/0105* (2013.01); *G02B 5/1809* (2013.01); *G02B 27/0172* (2013.01);
(Continued)

(58) Field of Classification Search
CPC ... G02F 1/0105; G02F 1/0009; G02B 5/1809; G02B 27/0172; G02B 2027/0178;
(Continued)

(56) References Cited

U.S. PATENT DOCUMENTS 5,105,403 A ‡ 4/1992 Kando ............... G11B 7/08582
                                                     369/11
7,538,946 B2 ‡ 5/2009 Smith .................... B82Y 20/00
                                                     359/56

(Continued)

OTHER PUBLICATIONS

Mohammadreza Khorasaninejad, et al., Achromatic Metasurface Lens at Telecommunication Wavelengths, Nano Letters, 2015, 15 (8), pp. 5358-5362.‡

(Continued)

*Primary Examiner* — Tracie Y Green
(74) *Attorney, Agent, or Firm* — Patterson + Sheridan, LLP

(57) ABSTRACT

Embodiments described herein relate to display devices, e.g., virtual and augmented reality displays and applications. In one embodiment, a planar substrate has stepwise features formed thereon and emitter structures formed on each of the features. An encapsulating layer is disposed on the substrate and a plurality of uniform dielectric nanostructures are formed on the encapsulating layer. Virtual images generated by the apparatus disclosed herein provide for improved image clarity by reducing chromatic aberrations at an image plane.

20 Claims, 4 Drawing Sheets

(51) Int. Cl.
  *G02F 1/00* (2006.01)
  *G02B 5/18* (2006.01)
  *G06T 19/00* (2011.01)
(52) U.S. Cl.
  CPC .... *G02F 1/0009* (2013.01); *G02B 2027/0116* (2013.01); *G02B 2027/0178* (2013.01); *G02B 2027/0196* (2013.01); *G06T 19/006* (2013.01)
(58) Field of Classification Search
  CPC .... G02B 2027/0116; G02B 2027/0196; G06T 19/006
  See application file for complete search history.

(56) References Cited

U.S. PATENT DOCUMENTS

| | | | | |
|---|---|---|---|---|
| 8,434,909 B2 ‡ | 5/2013 | Nichol | ............ | G02B 6/0018 362/29 |
| 8,467,133 B2 ‡ | 6/2013 | Miller | ............ | G02B 27/017 353/28 |
| 2011/0211256 A1 ‡ | 9/2011 | Connor | ............ | G02B 27/2285 359/463 |
| 2012/0243103 A1 ‡ | 9/2012 | Omura | ............ | G02B 27/0172 359/630 |
| 2014/0111856 A1 ‡ | 4/2014 | Brug | ............ | G02B 5/1809 359/463 |
| 2014/0252313 A1* | 9/2014 | Mariani | ............ | H01L 31/1884 257/21 |
| 2016/0116649 A1* | 4/2016 | Landrock | ............ | G02B 5/1809 359/567 |
| 2018/0164472 A1 ‡ | 6/2018 | Gao | ............ | G02B 3/0056 |
| 2019/0033683 A1* | 1/2019 | Ahmed | ............ | G02F 1/293 |

OTHER PUBLICATIONS

Written search report of ISR, dated Sep. 2018 (Year: 2018).‡
Mohammadreza Khorasaninejad, et al, Achromatic Metasurtace Lens at Telecommunication Wavelenths, Nano Letters, 2015, 15 (8), pp. 5358-5362.
Notice of Allowance for U.S. Appl. No. 15/992,305.
Mohammadreza Khorasaninejad, et al, Achromatic Metasurface Lens at Telecommunication Wavelenths, Nano Letters, 2015, 15 (8), pp. 5358-5362.

\* cited by examiner
‡ imported from a related application

NANOSTRUCTURED FLAT LENSES FOR DISPLAY TECHNOLOGIES

CROSS-REFERENCE TO RELATED APPLICATIONS

This application is a continuation of U.S. patent application Ser. No. 15/992,305, filed May 30, 2018, which claims benefit of Indian Provisional Patent Application No. 201741045374, filed Dec. 18, 2017, and Indian Provisional Patent Application No. 201741019417, filed Jun. 2, 2017, both of which are hereby incorporated by reference in their entirety.

BACKGROUND

Field

Embodiments of the present disclosure generally relate to display devices for augmented and virtual reality applications. More specifically, embodiments described herein relate to structured lenses for utilization in augmented and virtual reality displays.

Description of the Related Art

Augmented reality is generally considered to enable an experience in which a user can see through display lenses of glasses or other head-mounted display (HMD) devices to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences.

Virtual reality, however, is generally considered to be a computer generated simulated environment in which a user has an apparent physical presence. A virtual reality experience can be generated in 3D and viewed with a HMD, such as glasses of other wearable display devices that have near-eye display panels as lenses to display a virtual reality environment that replaces an actual environment.

Near eye display panels have several technical challenges. For example, limited field of view, display clarity associated with chromatic aberrations, and other challenges persist in implementing virtual reality displays that are capable of enabling an immersive virtual experience. More specifically, an optical path length difference, which is the product of the geometric length of the path light and the index of refraction of the medium through which the light propagates, may exist when utilizing light of varying wavelengths. As such, optical path length difference of red, green, and blue light may not be precisely focused on an image plane which leads to the aforementioned chromatic aberration. Accordingly, as an emerging technology, there are many challenges and design constraints present in fabricating displays for virtual and augmented reality devices.

SUMMARY

In one embodiment, a display apparatus is provided. The apparatus includes a substrate having a plurality of features formed thereon, a first feature disposed in a first plane, and a first emitter structure disposed on the first feature. The apparatus also includes a second feature disposed in a second plane different than the first plane, a second emitter structure disposed on the second feature, a third feature disposed in a third plane different than the first plane and the second plane, and a third emitter structure disposed on the third feature. An encapsulating layer is formed over the plurality of features and coupled to the substrate and a plurality of dielectric nanostructures are formed on the encapsulating layer.

In another embodiment, a display apparatus is provided. The apparatus includes a substrate having a plurality of features formed thereon, a first feature disposed in a first plane, a first emitter structure disposed on the first feature, and a first encapsulating layer formed over the first emitter structure. The apparatus also includes a second feature disposed in a second plane different than the first plane, a second emitter structure disposed on the second feature, and a second encapsulating layer formed over the second emitter structure. Still further, the apparatus includes a third feature disposed in a third plane different than the first plane and the second plane, a third emitter structure disposed on the third feature, and a third encapsulating layer formed over the third emitter structure. A plurality of dielectric nanostructures are formed on the first encapsulating layer, the second encapsulating layer, and the third encapsulating layer.

In yet another embodiment, a display apparatus is provided. The apparatus includes a substrate having a first surface and a second surface disposed opposite the first surface, wherein the first surface and the second surface are planar. A first emitter structure is disposed on the first surface, a second emitter structure is disposed on the first surface, and a third emitter structure is disposed on the first surface. An encapsulating layer is disposed over the first emitter structure, the second emitter structure, and the third emitter structure. A first plurality of dielectric nanostructures having first dimensions are disposed on the encapsulating layer corresponding to a region of the first emitter structure. A second plurality of dielectric nanostructures having second dimensions different than the first dimensions are disposed on the encapsulating layer corresponding to a region of the second emitter. A third plurality of dielectric nanostructures having third dimensions different than the first dimensions and the second dimensions are disposed on the encapsulating layer corresponding to a region of the third emitter structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to display devices, e.g. virtual and augmented reality devices and applications. In one embodiment, a planar substrate has stepwise features formed thereon and emitter structures formed on each of the features. An encapsulating layer is disposed on the substrate and a plurality of uniform dielectric nanostructures are formed on the encapsulating layer. Virtual images generated by the apparatus disclosed herein provide for improved image clarity by reducing chromatic aberrations at an image plane.

Figure 1:
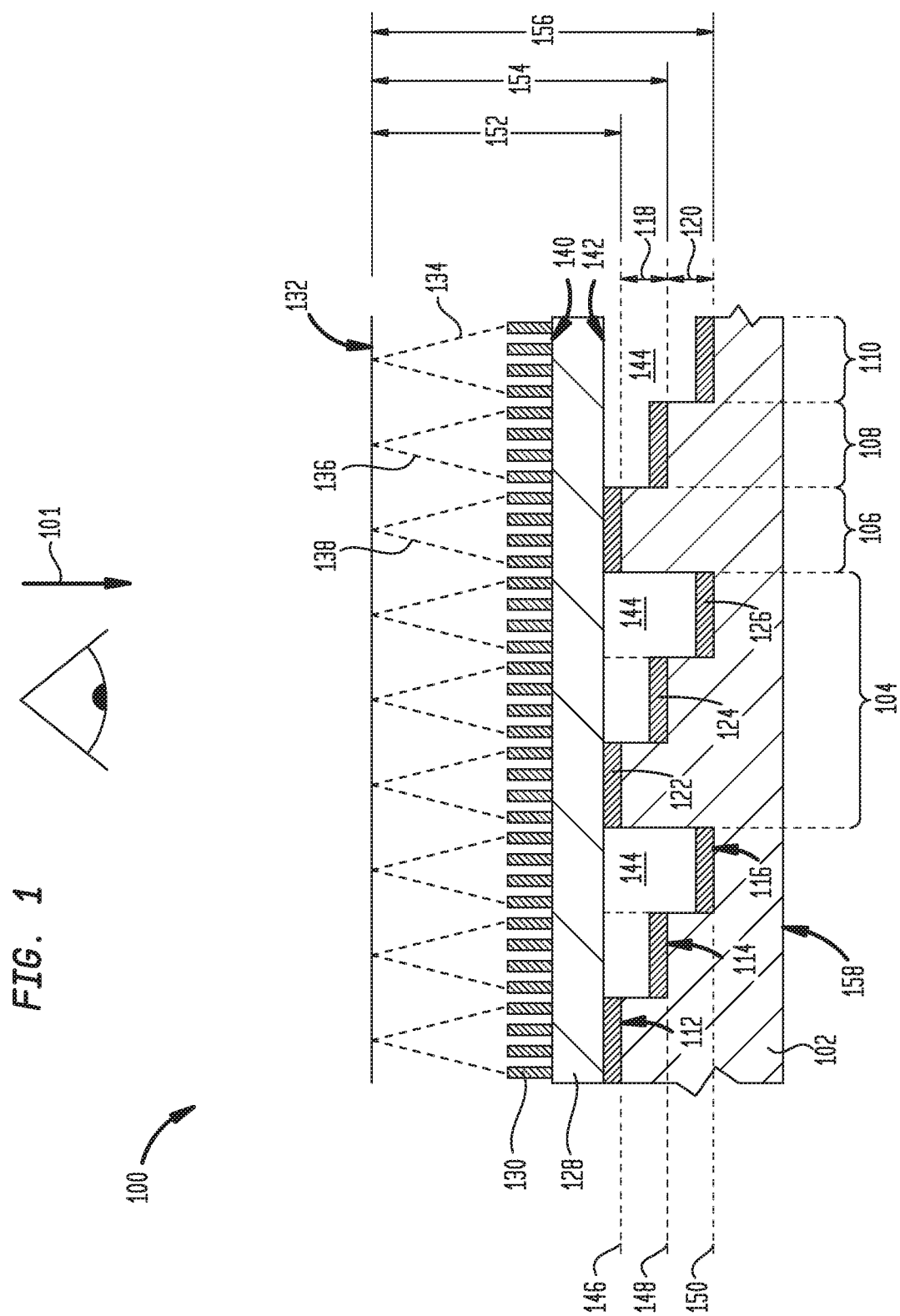
FIG. 1 is a schematic, cross-sectional view of a display apparatus according to an embodiment described herein.

FIG. 1 is a schematic, cross-sectional view of a display apparatus 100 according to an embodiment described herein. The display apparatus 100 includes a substrate 102 having a plurality of stepwise features 112, 114, 116 formed thereon. The substrate 102 is made of an optically transparent material, such as glass. Alternatively, the substrate 102 may be made of a sapphire material. In another embodiment, the substrate 102 may be made of an aluminum nitride material. The features 112, 114, 116 are patterned and etched into the substrate 102 by patterning and etching tools. Examples of such tools are available form Applied Materials Inc., Santa Clara, Calif.

The features 112, 114, 116 are formed on the substrate 102 opposite a planar surface 144 of the substrate 102. A first feature 112 defines a surface disposed in a first plane 146. A second feature 114 defines a surface disposed in a second plane 148. A third feature 116 defines a surface disposed in a third plane 150.

Each of the features 112, 114, 116 are disposed in planes different from one another. For example, each feature 112, 114, 116 is disposed at a plane having a unique focal length to an image plane 132. The first feature 112 disposed at the first plane 146 has a first focal length 152 from the first plane 146 to the image plane 132. The second feature 114 disposed at the second plane 148 has a second focal length 154 from the second plane 148 to the image plane 132. The third feature 116 disposed at the third plane 150 has a third focal length 156 from the third plane 150 to the image plane 132. The second focal length 154 is greater than the first focal length 152 and the third focal length 156 is greater than the second focal length 154. By varying the focal lengths 152, 154, 156 of the features 112, 114, 116, respectively, pre-compensation for chromatic aberration is achieved as discussed in greater detail below.

A plurality of emitter structures 122, 124, 126 are formed on the plurality of features 112, 114, 116. A first emitter structure 122 is disposed on the first feature 112. A second emitter structure 124 is disposed on the second feature 114. A third emitter structure 126 is formed on the third feature 116. Each of the emitter structures 122, 124, 126 generate light to form an image at the image plane 132. For example, the first emitter structure 122 emits light 138 which is imaged on the image plane 132, the second emitter structure 124 emits light 136 which is imaged on the image plane 132, and the third emitter structure 126 emits light 134 which is imaged on the image plane 132.

Examples of suitable devices for each of the emitter structures 122, 124, 126 include, but are not limited to, liquid crystal display (LCD) devices, light emitting diode (LED) devices, and organic light emitting diode (OLED) devices, among others. In one embodiment, the emitter structures 122, 124, 126 comprise a pixel 104 and the first emitter structure 122 is a first sub-pixel 106, the second emitter structure 124 is a second sub-pixel 108, and the third emitter structure 126 is a third sub-pixel 110. In an alternative embodiment, each of the first emitter structure 122, the second emitter structure 124, and the third emitter structure 126 may be considered pixels.

In one example, the first emitter structure 122 is configured to generate light at a first wavelength having a first bandwidth. In one embodiment, the first emitter structure 122 generates blue light. The second emitter structure 124 is configured to generate light at a second wavelength having a second bandwidth different from the first wavelength and first bandwidth. In one embodiment, the second emitter structure 124 generates green light. The third emitter structure 126 is configured to generate light at a third wavelength having a third bandwidth different from the first and second wavelengths and bandwidths, respectively. In one embodiment, the third emitter structure 126 generates red light.

Each of the emitter structures 122, 124, 126 are disposed on a respective one of the features 112, 114, 116. As such, each of the emitter structures 122, 124, 126 are disposed a different focal length from the image plane 132. The planes 146, 148, 150 defined by the features 112, 114, 116, respectively, and ultimately the color type of emitter structure disposed on the features is determined by performing finite-different time-domain simulations to determine a delta between the planes 146, 148, 150.

For example, the first feature 112 which defines the first plane 146 has a blue light emitter structure 122 disposed thereon. The second feature 114 which defines the second plane 148 has a green light emitter structure 124 disposed thereon. The third feature 116 which defines the third plane 150 has a red light emitter structure 126 disposed thereon. In this example, a plane delta 118 between the first plane 146 and the second plane 148 is determined by an order of wavelength difference between the blue light wavelength and the green light wavelength. Similarly, a plane delta 120 between the second plane 148 and the third plane 150 is determined by an order of wavelength difference between the green light wavelength and the red light wavelength. As a result, the relative positions of the features 112, 114, 116, and thus, the corresponding emitter structures 122, 124, 126, can be positioned relative to the image plane 132 in order to pre-compensate for optical path length differences of light having various wavelengths. Accordingly, chromatic aberration at the image plane 132 is reduced and image clarity is improved.

The display apparatus 100 further includes an encapsulating layer 128 and a plurality of nanostructures 130 disposed on the encapsulating layer 128. The encapsulating layer 128 is fabricated from an optically transparent material and functions to encapsulate the emitter structures 122, 124, 126 formed on the features 112, 114, 116. The encapsulating layer 128 has a first surface 142 and a second surface 140 disposed opposite the first surface 142. The first surface 142 and second surface 140 are both planar and parallel to one another. The first surface 142 is coupled to and disposed adjacent the substrate 102. In one embodiment, the encapsulating layer 128 is disposed in contact with at least one of the emitter structures, such as the first emitter structure 122 with the shortest optical path length 152.

Due to the stepwise morphology of the features 112, 114, 116 and the planar morphology of the encapsulating layer first surface 142, an interstitial space 144 is formed between the second and third features 114, 116, respectively, and the first surface 142 of the encapsulating layer 128. In one embodiment, the interstitial space 144 is filled with a gas, such as air or the like. In an alternative embodiment, the interstitial space 144 is filled with a material having a refractive index similar to either a refractive index of the substrate material or a refractive index of the encapsulating layer material.

The plurality of nanostructures 130 are disposed on the second surface 140 of the encapsulating layer 128. The plurality of nanostructures 130 are formed from a dielectric material, such as ZnO materials, $TiO_2$ materials, GaN materials, and combinations thereof. The dielectric material may by crystalline or amorphous, depending upon the desired optical properties associated different crystallographic lattice structures (or lack thereof). Each nanostructure of the plurality of nanostructures 130 is fabricated with substantially the same morphology. In other words, the plurality of nanostructures 130 are uniform. The morphology of each nanostructure 130 may be columnar, pillar-like, cubic, or the like. A height, width, length, diameter, spacing, or other physical characteristic of individual nanostructures are substantially similar to other nanostructures in the plurality of nanostructures 130. In one embodiment, a width/diameter of each nanostructure 130 is between about 100 nm and about 350 nm, a height of each nanostructure 130 is between about 200 nm and about 300 nm, and spacing between adjacent nanostructures is between about 50 nm and about 250 nm.

The nanostructures 130 are deposited by various techniques depending upon the type of dielectric material utilized to fabricate the nanostructures 130. Suitable deposition techniques include chemical vapor deposition, physical vapor deposition, molecular beam epitaxy and the like. Apparatus suitable for performing such deposition processes are tools available from Applied Materials, Inc., Santa Clara, Calif. Patterning of dielectric films deposited to form the nanostructures 130 includes processes such as nano-imprint lithography, e-beam lithography, or other lithographic techniques suitable for forming the nanostructures 130 with morphology sizes such as those described above. Thus, fabrication of uniform nanostructures 130 is more easily accomplished than forming unique morphology nanostructures.

Having pre-compensated for optical path length differences of different wavelength light by utilizing the step-wise features 112, 114, 116, the nanostructures 130 can be utilized to additionally focus the light on the image plane 132. For example, red light 134 emitted from the third emitter structure 126 is focused at the image plane 132, green light 136 emitted from the second emitter structure 124 is focused at the image plane 132, and blue light 138 emitted from the first emitter structure 122 is focused at the image plane 132. As a result of the optical path length pre-compensation of the stepwise features 112, 114, 116 and the light focusing characteristics of the nanostructures 130, an image can be viewed from a viewer's perspective 101 at the image plane 132 with improved clarity and without chromatic aberration. Accordingly, the light 134, 136, 138 is imaged in the same plane (e.g. the image plane 132) and a virtual image generated by the light in the plane can be viewed without any, or at least substantially reduced, chromatic aberration.

Figure 2:
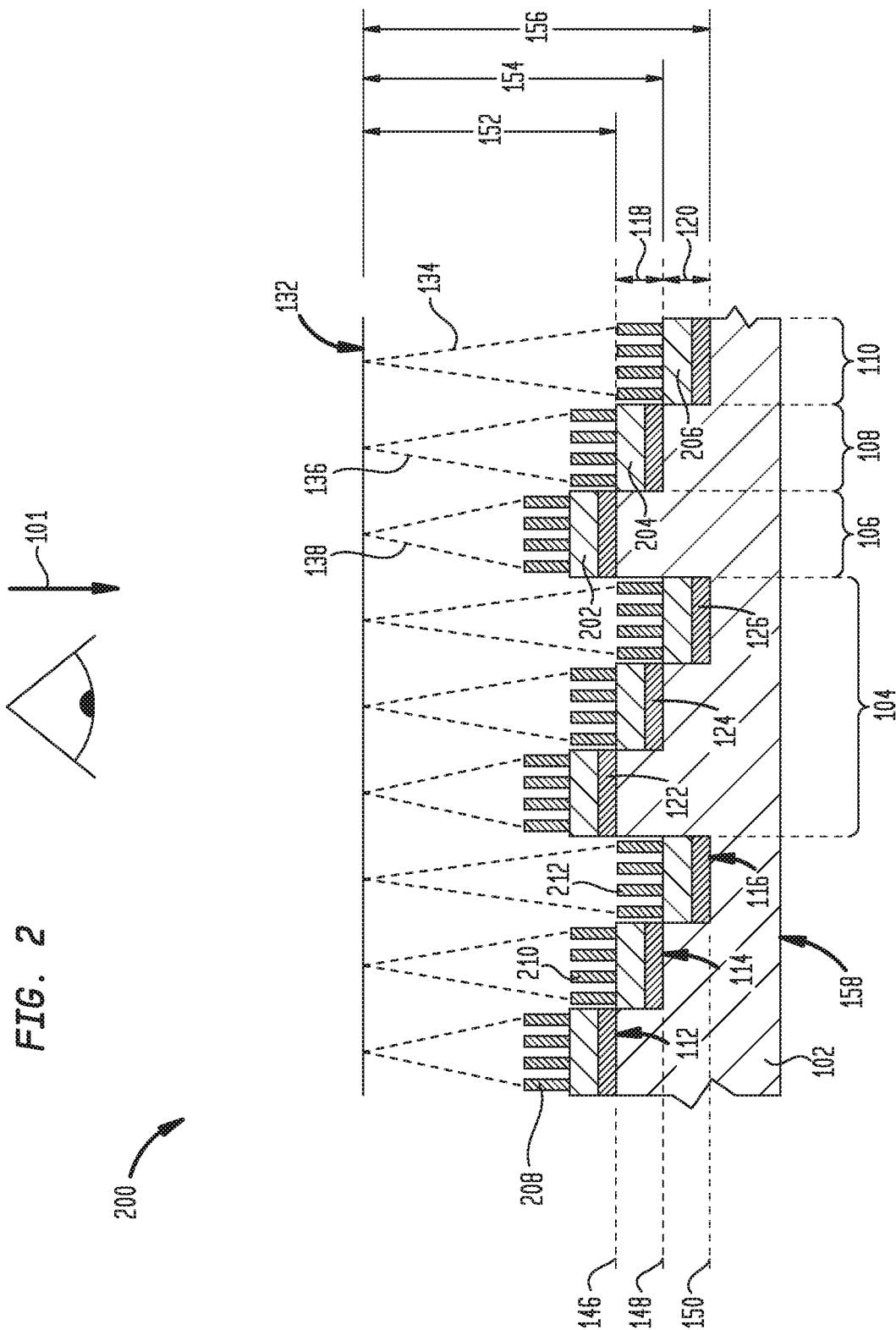
FIG. 2 is a schematic, cross-sectional view of a display apparatus according to an embodiment described herein.

FIG. 2 is a schematic, cross-sectional view of a display apparatus 200 according to an embodiment described herein. The display apparatus 200 includes a plurality of encapsulating layers 202, 204, 206 disposed on the emitter structures 122, 124, 126. For example, a first encapsulating layer 202 is disposed on and contacts the first emitter structure 122, a second encapsulating layer 204 is disposed on and contacts the second emitter structure 124, and a third encapsulating layer 206 is disposed on and contacts the third emitter structure 126. As such, the first, second, and third encapsulating layers 202, 204, 206, are oriented step-wise similar to the step-wise orientation of the features 112, 114, 116. The materials selected for the encapsulating layers 202, 204, 206 are similar to those of the encapsulating layer 128.

A first plurality of nanostructures 208 are disposed on the first encapsulating layer 202, a second plurality of nanostructures 210 are disposed on the second encapsulating layer 204, and a third plurality of nanostructures 212 are disposed on the third encapsulating layer 206. Similar to the nanostructures 130, each of the nanostructures 208, 210, 212 are formed from a dielectric material and have a uniform morphology. Not unlike the display apparatus 100, display apparatus 200 utilizes the optical path length pre-compensation of the step-wise features 112, 114, 116 and the light focusing characteristics of the nanostructures 130 to enable viewing of an image from a viewer's perspective 101 at the image plane 132 with improved clarity and without chromatic aberration.

Figure 3:
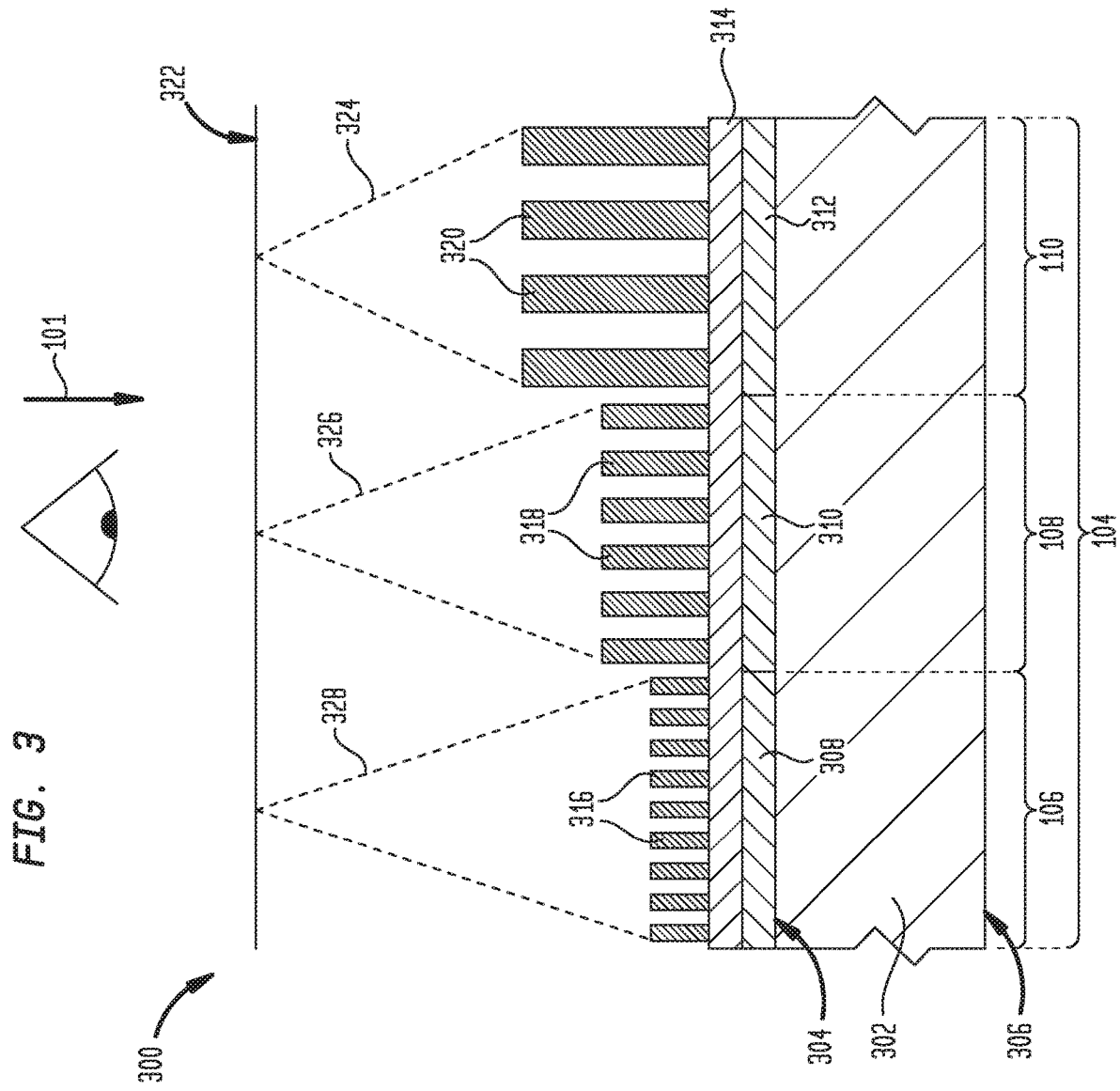
FIG. 3 is a schematic, cross-sectional view of a display apparatus according to an embodiment described herein.

FIG. 3 is a schematic, cross-sectional view of a display apparatus 300 according to an embodiment described herein. The display apparatus 300 includes a substrate 302 which has a first surface 304 and a second surface 306. The substrate 302 is substantially planar and the first surface 304 and second surface 306 are disposed opposite and parallel to one another. Materials utilized for the substrate 302 are similar to those selected for the substrate 102 described supra.

A first emitter structure 308, a second emitter structure 310, and a third emitter structure 312 are disposed on the first surface 304 which defines a common plane. The emitter structures 308, 310, 312 may be similar to the emitter structures 122, 124, 126 described above. The second emitter structure 310 is disposed adjacent to the first emitter structure 308 and the third emitter structure 312 is disposed adjacent to the second emitter structure 310. In one embodiment, the first emitter structure 308 is configured to generate a blue light, the second emitter structure 310 is configured to generate a green light, and the third emitter structure 312 is configured to generate a red light.

An encapsulating layer 314, fabricated from materials similar to those described with regard to the encapsulating layer 128, is disposed over the emitter structures 308, 310, 312. In one embodiment, the encapsulating layer 314 is disposed in contact with the emitter structures 308, 310, 312. The encapsulating layer 314 is substantially planar in morphology and has a substantially uniform thickness in all regions adjacent to the emitter structures 308, 310, 312.

A first plurality of nanostructures 316 are formed on the encapsulating layer 314 corresponding to a region of the first emitter structure 308, e.g. sub-pixel region 106 which is an area of the substrate 302 corresponding to the first emitter structure 308. The first nanostructures 316 share a uniform dimensional morphology (size, shape, and spacing) within the sub-pixel region 106. The dimensional morphology of the first nanostructures 316 is selected based upon a wavelength of light emitted from the first emitter structure 308 to compensate for optical path length differences between light of different wavelengths imaged at a singular image plane 322. For example, the first nanostructures 316 have a dimensional morphology selected to image and focus blue light 328 emitted from the first emitter structure 308 at the image plane 322.

A second plurality of nanostructures 318 are formed on the encapsulating layer 314 corresponding to a region of the second emitter structure 310, e.g. sub-pixel region 108. The second nanostructures 318 share a uniform dimensional morphology within the sub-pixel region 108. Similar to the first nanostructures 316, the dimensional morphology of the second nanostructures 318 is selected based upon a wavelength of light emitted from the second emitter structure 310 to compensate for optical path length differences between light of different wavelengths imaged at the image plane 322. The dimensional morphology of the second nanostructures 318 is different from the dimensional morphology of the first nanostructures 316. For example, the second nanostructures 318 have a dimensional morphology selected to image and focus green light 326 emitted from the second emitter structure 310 at the image plane 322.

A third plurality of nanostructures 320 are formed on the encapsulating layer 314 corresponding to a region of the third emitter structure 312, e.g. sub-pixel region 110. The third nanostructures 320 share a uniform dimensional morphology within the sub-pixel region 110. Similar to the first and second nanostructures 316, 318, respectively, the dimensional morphology of the third nanostructures 320 is selected based upon a wavelength of light emitted from the third emitter structure 312 to compensate for optical path length differences between light of different wavelengths imaged at the image plane 322. The dimensional morphology of the third nanostructures 320 is different from the dimensional morphology of the first nanostructures 316 and the second nanostructures 318. For example, the third nanostructures 320 have a dimensional morphology selected to image and focus red light 324 emitted from the third emitter structure 312 at the image plane 322.

Accordingly, image display can be achieved by utilizing the nanostructures 316, 318, 320 which compensate for optical path length differences of light having different wavelengths and the light focusing characteristics of the nanostructures 316, 318, 320 to view an image from a viewer's perspective 101 at the image plane 322 with improved clarity and without chromatic aberration.

Figure 4A:
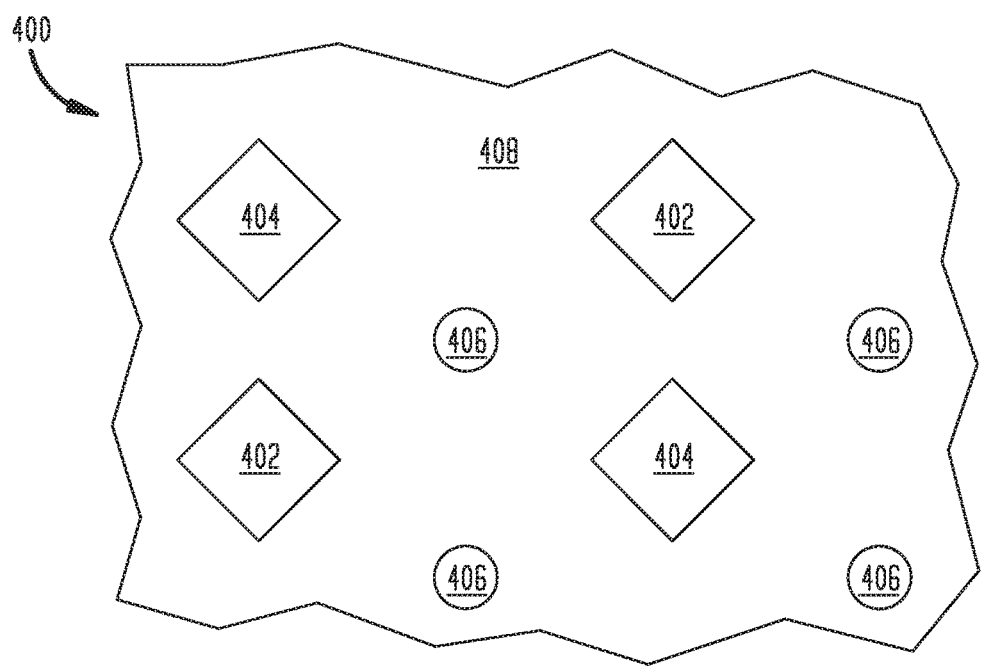
FIG. 4A is a partial schematic plan view of a light emitting diode (LED) array according to an embodiment described herein.

FIG. 4A is a partial schematic plan view of a light emitting diode (LED) array 400 according to an embodiment described herein. Examples of suitable LED arrays include, but are not limited to, LED devices and organic light emitting diode (OLED) devices, among others. In one embodiment, the LED array 400 includes a substrate 408 and has a plurality of pixels 402, 404, 406 disposed thereon. In one example, the LED array 400 is an OLED pentile array.

In one example, a first pixel 402 is configured to generate light at a first wavelength having a first bandwidth. In one embodiment, the first pixel 402 generates red light. A second pixel 404 is configured to generate light at a second wavelength having a second bandwidth different from the first wavelength and first bandwidth. In one embodiment, the second pixel 404 generates blue light. A third pixel 406 is configured to generate light at a third wavelength having a third bandwidth different from the first and second wavelengths and bandwidths, respectively. In one embodiment, the third pixel 406 generates green light.

Each of the pixels 402, 404, 406 is arranged on the substrate 408 in a pattern to form the array 400. In one embodiment, the pixels 402, 404, 406 have a uniform size and distribution architecture. In another embodiment, the pixels 402, 404, 406 each have a unique size, respectively, and a uniform distribution pattern across the array 400. While the pixels 402, 404 are illustrated as having a predominantly quadrilateral shape, it is contemplated that any desirable shape may be utilized for the pixels 402, 404. Similarly, while the pixels 406 are illustrated as having a circular or oblong shape, it is contemplated that any desirable shape may be utilized for the pixels 406.

Figure 4B:
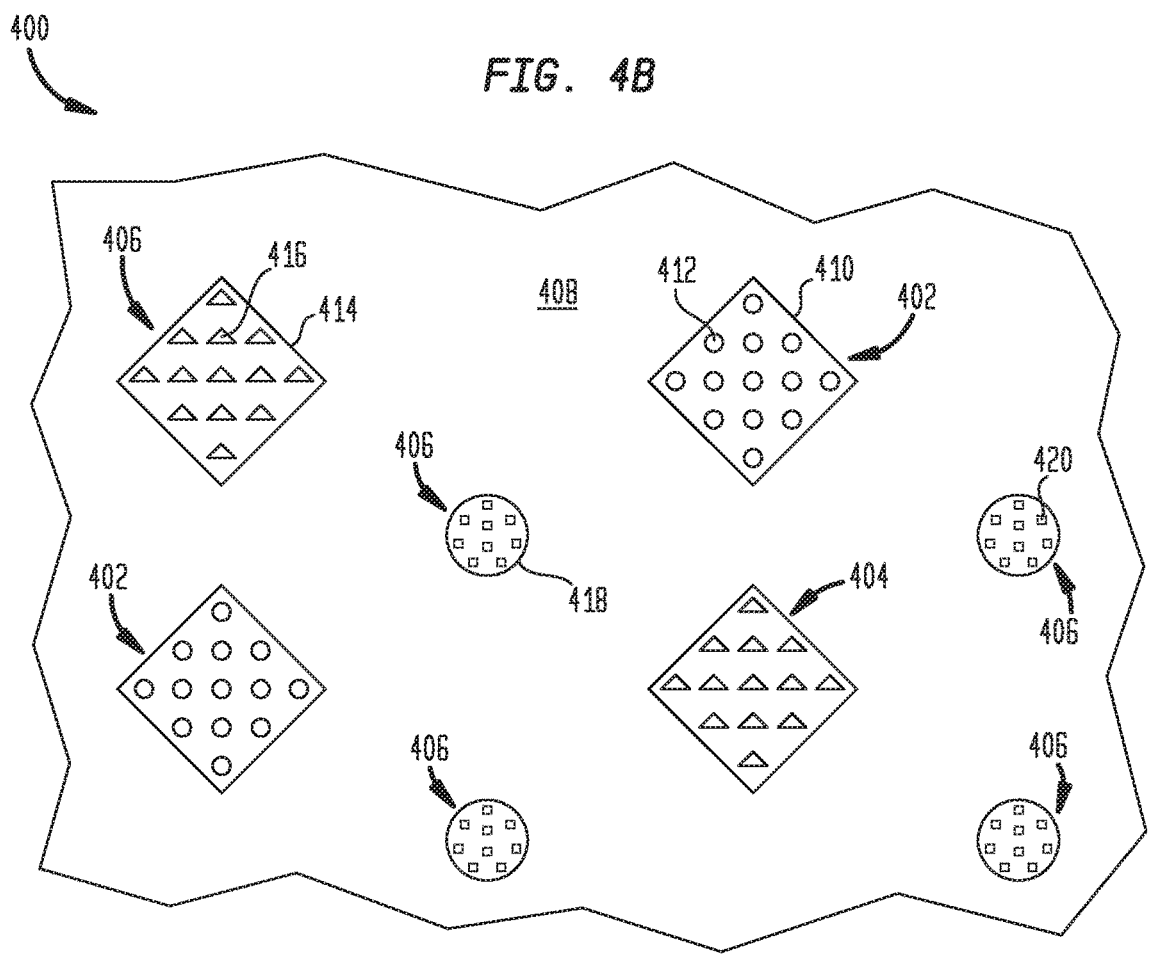
FIG. 4B is a partial schematic plan view of the LED array of FIG. 4A with nanolenses disposed on pixels of the LED array according to an embodiment described herein.

FIG. 4B is a partial schematic plan view of the LED array 400 of FIG. 4A with nanolenses 410, 414, 418 disposed on the pixels 402, 404, 406, respectively, of the LED array 400 according to an embodiment described herein. A first nanolens 410 having a plurality of first nanostructures 412 formed thereon is disposed on the first pixels 402. A second nanolens 414 having a plurality of second nanostructures 416 formed thereon is disposed on the second pixels 404. A third nanolens 418 having a plurality of third nanostructures 420 formed thereon is disposed on the third pixels 406. Each of the nanolenses 410, 414, 418 are sized and shaped to substantially correspond to the size and shape of the corresponding underlying pixels 402, 404, 406.

In one embodiment, each of the nanolenses 410, 414, 418 are monochromatic lenses. In this embodiment, the plurality of nanostructures 412, 416, 420 corresponding to each nanolens 410, 414, 418 are adapted to modulate light of a single wavelength or defined range of wavelengths emitted from corresponding pixels 402, 404, 406. For example, the first plurality of nanostructures 412 disposed on the first nanolens 410 are adapted to reduce or eliminate chromatic aberrations and to compensate for an optical path length of red light at an image plane. The second plurality of nanostructures 416 disposed on the second nanolens 414 are adapted to reduce or eliminate chromatic aberrations and to compensate for an optical path length of blue light at the image plane. The third plurality of nanostructures 420 disposed on the third nanolens 418 are adapted to reduce or eliminate chromatic aberrations and compensate for an optical path length of green light at the image plane. Thus, it is possible to form a focused image at the image plane with light of varying wavelengths.

The nanolenses and nanostructures of each of the nanolenses 410, 414, 418 and nanostructures 412, 416, 420, respectively, are formed from a dielectric material, such as ZnO materials, $TiO_2$ materials, GaN materials, and combinations thereof. The dielectric material may by crystalline or amorphous, depending upon the desired optical properties associated different crystallographic lattice structures (or lack thereof). In one embodiment, each nanostructure of the plurality of first nanostructures 412 disposed on the nanolenses 410 is fabricated with a substantially uniform first morphology. Each nanostructure of the plurality of second nanostructures 416 disposed on the nanolenses 414 is fabricated with a substantially uniform second morphology different from the first morphology. Each nanostructure of the plurality of third nanostructures 420 disposed on the nanolenses 418 is fabricated with a substantially uniform third morphology different from the first morphology and the second morphology. In this embodiment, the first morphology is adapted to modulate red light, the second morphology is adapted to modulate blue light, and the third morphology is adapted to modulate green light While each of the first, second, and third morphologies are unique, the morphology of each of the nanostructures 412, 416, 420 may be columnar, pillar-like, cubic, or the like. A height, width, length, diameter, spacing, or other physical characteristic of the nanostructures 412, 416, 420 are unique to the first, second, and third morphologies, respectively. In one embodiment, a width of each nanostructure of the nanostructures 412, 416, 420 is between about 50 nm and about 100 nm.

In another embodiment, a height of each nanostructure of the nanostructures 412, 416, 420 is an order of wavelength different corresponding to the light color being modulated by the nanolenses 410, 414, 418, respectively. For example, a height of the nanostructures 412 corresponds to a wavelength difference between red light emitted from the pixels 402 and blue and green light emitted from adjacent pixels 404, 406, respectively. A height of the nanostructures 416 corresponds to a wavelength difference between blue light emitted from the pixels 404 and red and green light emitted from adjacent pixels 402, 406, respectively. A height of the nanostructures 420 corresponds to a wavelength difference between green light emitted from the pixels 406 and red and blue light emitted from adjacent pixels 402, 404, respectively.

The nanostructures 412, 416, 420 are deposited by various techniques depending upon the type of dielectric material utilized to fabricate the nanostructures 412, 416, 420. Suitable deposition techniques include chemical vapor deposition, physical vapor deposition, molecular beam epitaxy and the like. Apparatus suitable for performing such deposition processes are tools available from Applied Materials, Inc., Santa Clara, Calif.

Patterning of dielectric films deposited to form the nanostructures 412, 416, 420 includes processes such as nanoimprint lithography, e-beam lithography, or other lithographic techniques suitable for forming the nanostructures 412, 416, 420 with morphologies such as those described above. As such, monochromatic nanolenses with corresponding nanostructures may be formed in a manner unique to each of the pixels 402, 404, 406. It is also contemplated that in addition to nanolenses as described above, the embodiments described herein may be implemented in other light modulation devices, such as polarizers, wave retardation plates, and the like.

While the foregoing is directed to embodiments of the present disclosure, other and further embodiments of the disclosure may be devised without departing from the basic scope thereof, and the scope thereof is determined by the claims that follow.

What is claimed is:

1. A display apparatus, comprising:
   a substrate;
   a first pixel formed on the substrate;
   a first nanolens disposed on the first pixel;
   a second pixel formed on the substrate;
   a second nanolens disposed on the second pixel;
   a third pixel formed on the substrate; and
   a third nanolens disposed on the third pixel, wherein each of the first pixel, the second pixel, and the third pixel has a substantially uniform size and distribution across the substrate.

2. The apparatus of claim 1, wherein the first pixel is configured to generate light at a first wavelength having a first bandwidth.

3. The apparatus of claim 2, wherein the first pixel is configured to generate red light.

4. The apparatus of claim 3, wherein the first nanolens comprises a plurality of first nanostructures.

5. The apparatus of claim 4, wherein the first nanostructures are adapted to compensate for an optical path length of red light at an image plane.

6. The apparatus of claim 2, wherein the second pixel is configured to generate light at a second wavelength having a second bandwidth different from the first wavelength and the first bandwidth.

7. The apparatus of claim 6, wherein the second pixel is configured to generate blue light.

8. The apparatus of claim 7, wherein the second nanolens comprises a plurality of second nanostructures.

9. The apparatus of claim 8, wherein the second nanostructures are adapted to compensate for an optical path length of blue light at an image plane.

10. The apparatus of claim 6, wherein the third pixel is configured to generate light at a third wavelength having a third bandwidth different from the first and second wavelength and the first and second bandwidth.

11. The apparatus of claim 10, wherein the third pixel is configured to generate green light.

12. The apparatus of claim 11, wherein the third nanolens comprises a plurality of third nanostructures.

13. The apparatus of claim 12, wherein the third nanostructures are adapted to compensate for an optical path length of green light at an image plane.

14. A display apparatus, comprising:
    a substrate;
    a red light pixel formed on the substrate;
    a first nanolens disposed on the red light pixel;
    a blue light pixel formed on the substrate;
    a second nanolens disposed on the blue light pixel;
    a green light pixel formed on the substrate; and
    a third nanolens disposed on the green light pixel, wherein each of the red light pixel, the blue light pixel, and the green light pixel have a unique size and uniform distribution across the substrate.

15. The apparatus of claim 14, wherein each of the red light pixel, the blue light pixel, and the green light pixel are quadrilateral shaped.

16. The apparatus of claim 15, wherein each of the first nanolens, the second nanolens, and the third nanolens are sized and shaped to substantially correspond with the size and shape of the red light pixel, the blue light pixel, and the green light pixel, respectively.

17. The apparatus of claim 14, wherein each of the red light pixel, the blue light pixel, and the green light pixel are circular or oblong shaped.

18. The apparatus of claim 17, wherein each of the first nanolens, the second nanolens, and the third nanolens are sized and shaped to substantially correspond with the size and shape of the red light pixel, the blue light pixel, and the green light pixel, respectively.

19. A display apparatus, comprising:
    a substrate;
    a first pixel formed on the substrate;
    a first nanolens disposed on the first pixel, the first nanolens comprising first dielectric nanostructures adapted to compensate for an optical path length of red light at an image plane;
    a second pixel formed on the substrate;
    a second nanolens disposed on the second pixel, the second nanolens comprising second dielectric nanostructures adapted to compensate for an optical path length of blue light at the image plane;
    a third pixel formed on the substrate; and
    a third nanolens disposed on the third pixel, the third nanolens comprising third dielectric nanostructure adapted to compensate for an optical path length of green light at the image plane.

20. The apparatus of claim 19, wherein each of the first, second, and third dielectric nanostructures reduce or eliminate chromatic aberrations at the image plane.

* * * * *